United States Patent
Stupar et al.

(10) Patent No.: US 9,029,259 B2
(45) Date of Patent: *May 12, 2015

(54) SELF-ALIGNING HYBRIDIZATION METHOD

(71) Applicant: Teledyne Scientific & Imaging, LLC, Thousand Oaks, CA (US)

(72) Inventors: Philip A. Stupar, Oxnard, CA (US); Yu-Hua K. Lin, Oak Park, CA (US); Donald E. Cooper, Moorpark, CA (US); Jeffrey F. DeNatale, Thousand Oaks, CA (US); William E. Tennant, Thousand Oaks, CA (US)

(73) Assignee: Teledyne Scientific & Imaging, LLC, Thousand Oaks, CA (US)

(*) Notice: Subject to any disclaimer, the term of this patent is extended or adjusted under 35 U.S.C. 154(b) by 95 days.

This patent is subject to a terminal disclaimer.

(21) Appl. No.: 13/716,759

(22) Filed: Dec. 17, 2012

(65) Prior Publication Data

US 2014/0061838 A1   Mar. 6, 2014

Related U.S. Application Data

(60) Provisional application No. 61/600,336, filed on Feb. 17, 2012.

(51) Int. Cl.
  *H01L 21/76* (2006.01)
  *H01L 31/02* (2006.01)
  *H01L 31/18* (2006.01)
  *H01L 23/13* (2006.01)

(52) U.S. Cl.
  CPC .......... *H01L 31/02005* (2013.01); *H01L 31/18* (2013.01); *H01L 23/13* (2013.01)

(58) Field of Classification Search
  CPC ................... H01L 31/02005; H01L 21/76802
  USPC ............................ 257/433, 621, 686; 438/667
  See application file for complete search history.

(56) References Cited

U.S. PATENT DOCUMENTS

| | | | |
|---|---|---|---|
| 4,774,632 A | 9/1988 | Neugebauer | 361/386 |
| 4,918,811 A | 4/1990 | Eichelberger et al. | 29/840 |
| 4,924,353 A | 5/1990 | Patraw | 361/400 |
| 5,016,138 A | 5/1991 | Woodman | 361/381 |
| 5,040,994 A | 8/1991 | Nakamoto et al. | 439/76 |
| 5,250,843 A | 10/1993 | Eichelberger | 257/692 |
| 5,325,265 A | 6/1994 | Turlik et al. | 361/702 |
| 5,435,734 A | 7/1995 | Chow | 439/69 |
| 6,798,072 B2 * | 9/2004 | Kajiwara et al. | 257/778 |

(Continued)

*Primary Examiner* — Nathan Ha

(74) *Attorney, Agent, or Firm* — Koppel, Patrick, Heybl & Philpott

(57) ABSTRACT

A self-aligning hybridization method enabling small pixel pitch hybridizations with self-alignment and run-out protection. The method requires providing a first IC, the surface of which includes at least one electrical contact for connection to a mating IC, depositing an insulating layer on the IC's surface, patterning and etching the insulating layer to provide recesses in the insulating layer above each of the electrical contacts, and depositing a deformable conductive material in each of the recesses. A mating IC is provided which includes conductive pins positioned to align with the deformable conductive material in respective ones of the recesses on the first chip. The first and mating ICs are then hybridized by bringing the conductive pins into contact with the deformable conductive material in the recesses, such that the conductive material deforms and the pins make electrical contact with the first IC's electrical contacts.

22 Claims, 3 Drawing Sheets

(56) References Cited

U.S. PATENT DOCUMENTS

| | | | |
|---|---|---|---|
| 6,971,160 B1 | 12/2005 | Welch et al. | 29/832 |
| 7,014,094 B2* | 3/2006 | Alcoe | 228/180.22 |
| 7,145,219 B2 | 12/2006 | Faris | 257/618 |
| 7,872,332 B2* | 1/2011 | Fay et al. | 257/621 |
| 8,021,965 B1* | 9/2011 | Bernstein et al. | 438/462 |
| 8,293,547 B2 | 10/2012 | Karp et al. | 438/16 |
| 8,810,006 B2* | 8/2014 | Yu et al. | 257/620 |
| 2006/0209137 A1* | 9/2006 | Kojima et al. | 347/68 |
| 2009/0278246 A1* | 11/2009 | Hoshino et al. | 257/686 |
| 2010/0052107 A1* | 3/2010 | Bauer | 257/621 |
| 2010/0288525 A1* | 11/2010 | Basavanhally et al. | 174/50.52 |
| 2013/0234296 A1* | 9/2013 | Fay et al. | 257/621 |

* cited by examiner

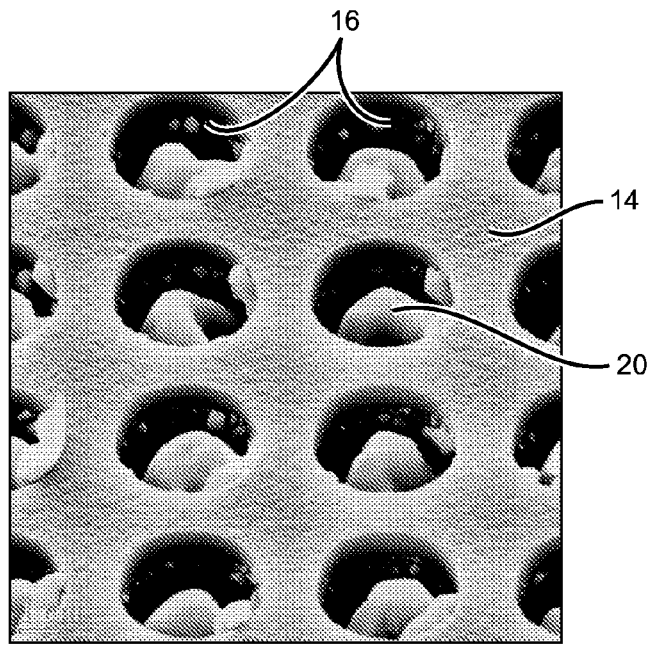
FIG. 8
FIG. 9
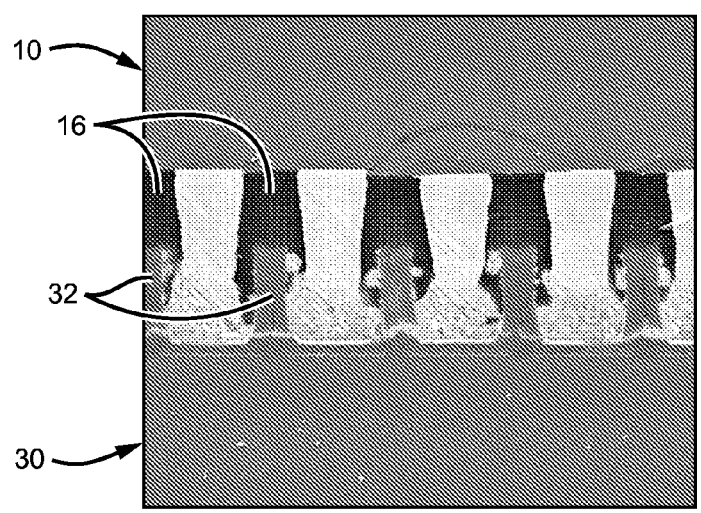

SELF-ALIGNING HYBRIDIZATION METHOD

RELATED APPLICATIONS

This application claims the benefit of provisional patent application No. 61/600,336 to P. Stupar et al., filed Feb. 17, 2012.

GOVERNMENT LICENSE RIGHTS

This invention was made with Government support under contract W31P4Q-09-C-0513 awarded by the Defense Advanced Research Projects Agency (DARPA). The Government has certain rights in this invention.

BACKGROUND OF THE INVENTION

1. Field of the Invention

This invention relates generally to methods of interconnecting multiple chips to form a hybrid device, and more particularly to a self-aligning hybridization method which is well-suited for small pixel pitch applications.

2. Description of the Related Art

A "hybrid" device typically contain two or more separately-fabricated integrated circuits (ICs or "chips") within a common package. Generally, the separate chips must be interconnected in some fashion to provide a functional device. The techniques used to facilitate the interconnection is commonly referred to "hybridization".

The chips within a given hybrid are often in a 'stacked' arrangement, with an interconnection means employed between the chips to connect contact pads on the top of the lower chip with corresponding contact pads on the bottom of the upper chip. One common hybridization technique uses indium bumps deposited on both chips' mating surfaces. The chips are then brought into contact with each other such that the bumps are pressed together, causing them to deform and bond together. However, there is no means of ensuring the alignment of the respective indium bumps; in fact, in practice, the bumps are often out of alignment and slip off each other.

Another problem with this conventional hybridization technique is 'run-out'. An indium bump is typically around 10 μm in diameter before being deformed as described above, with a target compression of about 50%. When pressed together, the diameter of the bump(s) expands, which is known as run-out. However, the indium can deform too much or in unpredictable directions, which can lead to shorts when adjacent contacts are in close proximity to each other. For example, a hybrid detector device typically includes a first chip containing a large array of pixels, each of which must interface with a second, control IC. The distance between the centerlines of adjacent pixels is referred to as 'pixel pitch'. As pixel pitch drops below 10 μm, both indium run-out and hybridization alignment can make existing methods of interconnecting the chips unsuitable.

One approach to mitigating these problems is offered by DRS Technologies, who describe a fine-pitch bump technology in which one chip mating surface has metal pads in respective recesses, and the other mating surface has indium bumps which are intended to contact the metal pads when the chips are brought together. However, there is still no means of ensuring the alignment of the indium bumps with the metal pads.

SUMMARY OF THE INVENTION

A self-aligning hybridization method is disclosed which addresses the problems noted above, enabling small pixel pitch hybridizations with self-alignment and run-out protection.

The present method joins two ICs together to form a hybrid circuit. The method requires providing a first IC, the surface of which includes at least one electrical contact for connection to a mating IC, depositing an insulating layer on the IC's surface, patterning and etching the insulating layer to provide recesses in the insulating layer above each of the electrical contacts, and depositing a deformable conductive material in each of the recesses. A mating IC is provided which includes conductive pins positioned to align with the deformable conductive material in respective ones of the recesses on the first chip. The first IC and mating IC are then hybridized by bringing the conductive pins into contact with the deformable conductive material in the recesses, such that the deformable conductive material deforms and the pins make electrical contact with the first IC's electrical contacts. The recesses contain the deformed conductive material, thereby preventing run-out, as well as shorting between adjacent contacts and/or pins.

These and other features, aspects, and advantages of the present invention will become better understood with reference to the following drawings, description, and claims.

BRIEF DESCRIPTION OF THE DRAWINGS

FIG. 8 is an image of indium-filled recesses in accordance with the present method.

FIG. 9 is an image of two ICs which have been hybridized in accordance with the present method, with a 5 μm pitch between indium bumps.

DETAILED DESCRIPTION OF THE INVENTION

The present hybridization method requires depositing a deformable conductive material such as indium into a recess formed in an insulating layer on a first IC, and making electrical connections to a second, mating IC via corresponding pins—preferably tapered pins—which extend from the mating IC. This process provides self-alignment between the ICs, and protects against run-out of the deformable conductive material.

Figure 1:
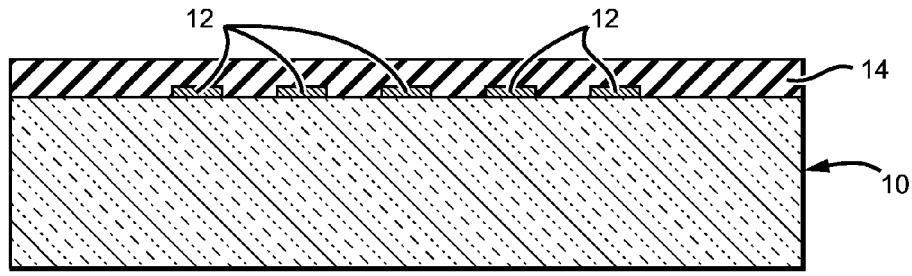
FIGS. 1-7 illustrate the present self-aligning hybridization method.

The present self-aligning hybridization method is illustrated in FIGS. 1-7. In FIG. 1, a first IC 10 is shown, the surface of which includes at least one electrical contact 12 to be interconnected to a mating IC. An insulating layer 14 is deposited on the surface of IC 10 and over contacts 12. The insulating layer is preferably an oxide such as $SiO_2$, which is preferably deposited using plasma-enhanced chemical vapor deposition (PECVD). The thickness of insulating layer 14 is preferably about 3 μm.

Figure 2:
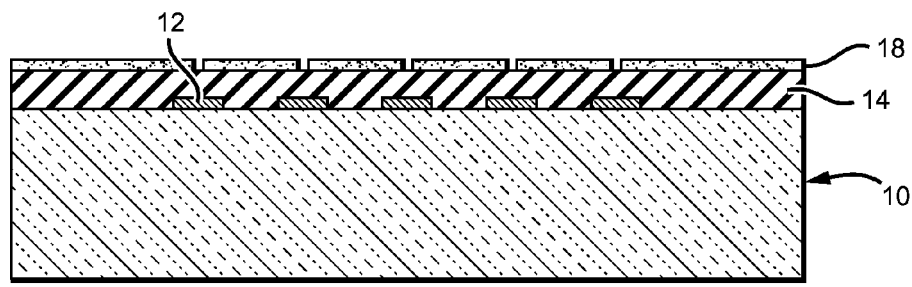
Figure 3:
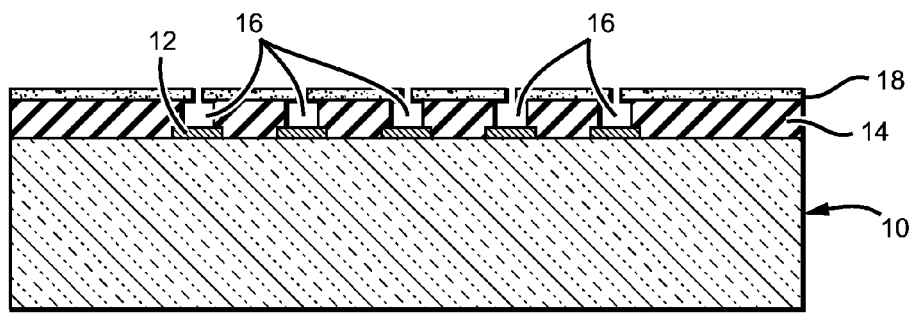

In FIGS. 2 and 3, insulating layer 14 is deposited, patterned and etched to provide recesses 16 in the insulating layer above each of electrical contacts 12. This is preferably accomplished by depositing and patterning a layer of photoresist 18 on insulating layer 14 as shown in FIG. 2, and then etching the photoresist-masked IC to create recesses 16 in insulating layer 14 above electrical contacts 12 (FIG. 3). Insulating layer 14 is etched all the way down to the electrical contacts, preferably using an anisotropic deep etch such as RIE. A short isotropic oxide etch may then be performed to undercut the resist layer to facilitate later liftoff of the deformable conductive material deposited in FIG. 4.

Figure 4:
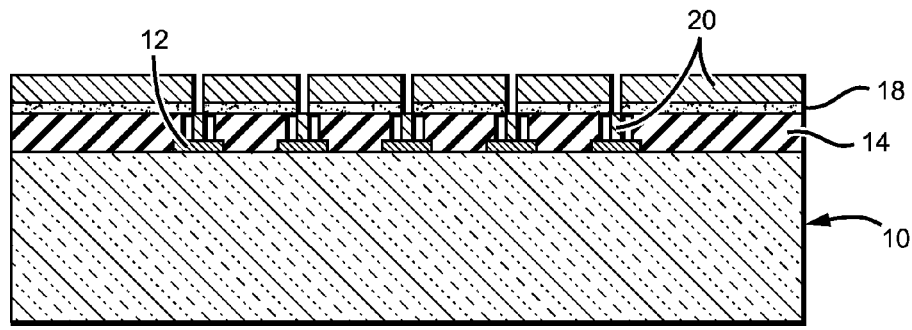
Figure 5:
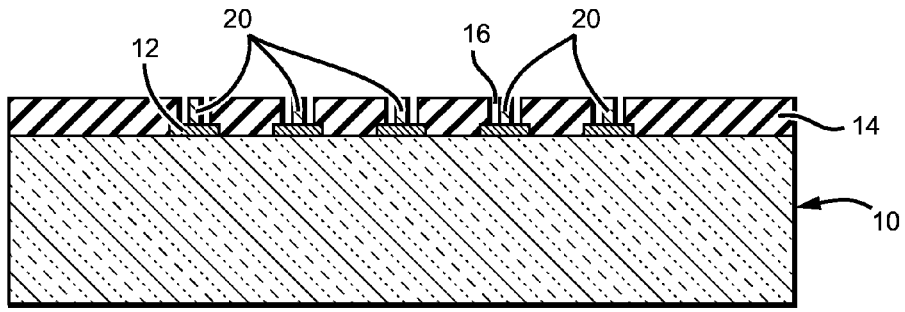

In FIG. 4, a deformable conductive material 20, preferably indium, is deposited on top of the resist-coated wafer, such that at least some conductive material 20 is deposited in each of recesses 16. The indium can be deposited by a variety of methods, including thermal evaporation, sputtering, electron beam evaporation, or plating, with thermal evaporation being the preferred method. Then in FIG. 5, the resist 18 is removed, typically by wet solvent processing, lifting off all the deformable conductive material 20 except that which was deposited into recesses 16. These steps serve to self-align the indium deposition with recesses 16.

Figure 6:
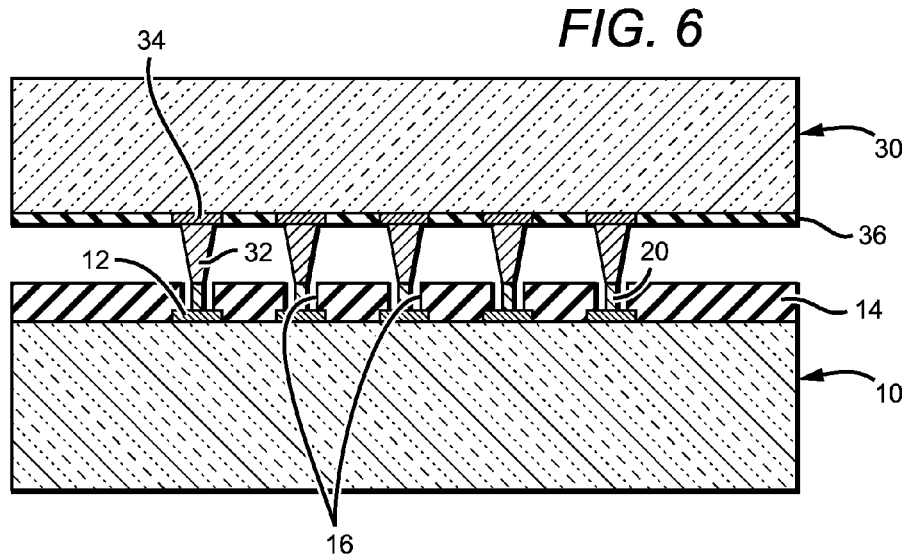

A mating IC 30 is shown in FIG. 6. The mating IC includes conductive pins 32, positioned to align with the deformable conductive material 20 in respective recesses 16 in the insulating layer 14 of IC 10. Conductive pins 32 would typically be electrically connected to respective metal contact pads 34 in mating IC 30, and separated by an insulation layer 36 to prevent the pins from shorting. Conductive pins 32 are preferably tapered, which helps them to self-center within their respective recesses and thereby improve the alignment between the pins of mating chip 30 and the recesses 16 of chip 10. Conductive pins 32 can be formed on IC 30 by a variety of methods; one preferred method requires plating metal into a resist mold, and subsequently removing the resist mold.

Figure 7:
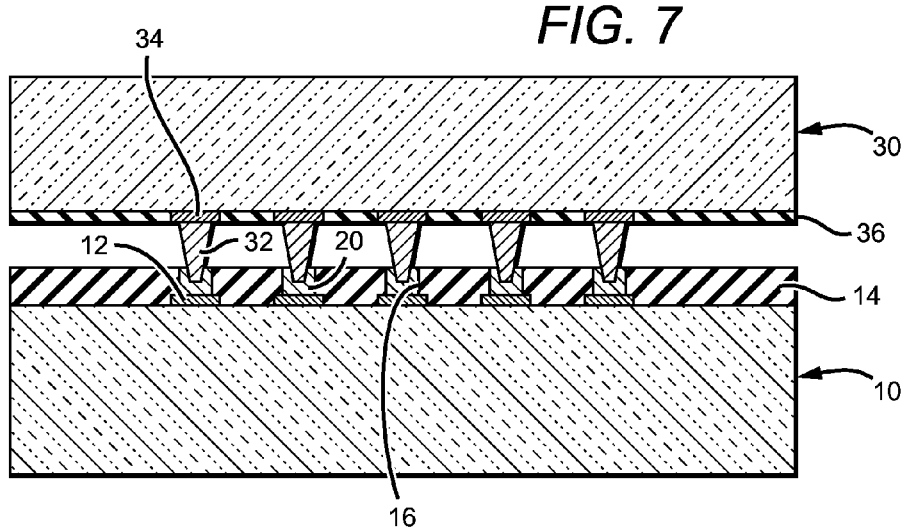

Then in FIG. 7, first IC 10 and mating IC 30 are hybridized by bringing pins 32 into contact with the deformable conductive material 20 in recesses 16, such that the deformable conductive material deforms and the pins make electrical contact with the first IC's electrical contacts 12. Recesses 16 serve to contain conductive material 20, thereby preventing run-out, as well as shorting between adjacent contacts and/or pins. One common application of the present hybridization method is with a detector array and a mating control IC; in this case, the recesses and self-alignment aspects of the present method prevent shorting between pixels.

An image depicting an array of recesses 16 in an insulating layer 14, each of which contains a deformable conductive material 20 as described above, is shown in FIG. 8. Then in FIG. 9, portions of two surrogate ICs 10, 30 which have been hybridized in accordance with the present method are shown, with the pins 32 of IC 30 self-centered within the recesses 16 of IC 10; in the exemplary embodiment shown, there is a 5 μm pitch between indium bumps.

This present method provides numerous improvements over the existing art. For example, the self-centering/self-alignment of the pins on one chip within the recesses on the mating chip serves to automatically correct for hybridization alignment errors, thereby making it easier to meet any alignment requirements. Also, as noted above, the deformable conductive material is contained within the recesses, thus preventing shorting between contacts, pins, and/or pixels that might otherwise occur. Though the present process is simple, it has been found to enable fine-pitch (<5 um) interconnects between chips in a hybrid device.

As discussed above, the deformable conductive material may be indium, but a more rigid conductive material might also be used in the recesses, to avoid potential slip due to indium deformation when under pressure from the pins. Thus, $SiO_2$ can be patterned into the recesses, which are then filled with indium as described above. Alternatively, the recesses can be coated with other metals such as gold.

Though the present method has been described in relation to a hybrid detector device, it may be used with virtually any hybrid device that contains at least two ICs which need to be interconnected. For example, one other possible application of the method is to facilitate CMOS chip stacking. Here, vertically integrated CMOS chips would benefit from the denser interconnect patterns that are made possible with this hybridization method. Another possible application is a hybrid assembly of ICs made from dissimilar materials or circuit processes.

Note that, as used herein, an "IC" can be any device which has electrical functionality. For example, an IC can be an integrated MEMS device or integrated passive elements.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of hybridizing at least two integrated circuits (ICs) to form a hybrid circuit, comprising:
    providing a first IC, the surface of which includes at least one electrical contact for connection to a mating IC;
    depositing an insulating layer on the surface of said first IC and over said at least one electrical contact;
    patterning and etching said insulating layer to provide recesses in said insulating layer above each of said electrical contacts;
    depositing a deformable conductive material in each of said recesses;
    providing said mating IC, said mating IC including conductive pins positioned to align with the deformable conductive material in respective ones of said recesses; and
    hybridizing said first and mating ICs by bringing said conductive pins into contact with said deformable conductive material in said recesses such that said deformable conductive material deforms and said pins make electrical contact with said first IC's electrical contacts.

2. The method of claim 1, wherein said insulating layer is $SiO_2$.

3. The method of claim 1, wherein said insulating layer is deposited using Plasma Enhanced Chemical Vapor Deposition (PECVD).

4. The method of claim 1, wherein patterning and etching said insulating layer comprises:
    depositing and patterning photoresist on said insulating layer; and
    etching said photoresist-masked IC such that said recesses in said insulating layer above said first IC's electrical contacts are created.

5. The method of claim 4, wherein etching said photoresist-masked IC comprises:
    performing an anisotropic deep etch; and
    performing an isotropic undercut etch.

6. The method of claim 4, wherein depositing a deformable conductive material in each of said recesses comprises:
    depositing said deformable conductive material on said patterned photoresist and in said recesses; and
    removing said photoresist such that said deformable conductive material is lifted off of said first IC except in said recesses.

7. The method of claim 1, wherein said deformable conductive material is indium.

8. The method of claim 7, wherein said indium is deposited by thermal evaporation, sputtering, electron beam evaporation, or plating.

9. The method of claim 1, wherein said first IC is a control IC and said mating IC is a detector array.

10. The method of claim 9, wherein said detector array has a pixel pitch of <10 μm.

11. The method of claim 1, wherein said conductive pins are tapered.

12. The method of claim 11, wherein said conductive pins are connected to respective contact pads in said mating IC.

13. A method of hybridizing at least two integrated circuits (ICs) to form a hybrid circuit, comprising:
- providing a first IC, the surface of which includes at least one electrical contact for connection to a mating IC;
- depositing an $SiO_2$ insulating layer on the surface of said first IC and over said at least one electrical contact;
- depositing and patterning photoresist on said insulating layer above each of said electrical contacts;
- etching said photoresist-masked IC such that recesses in said $SiO_2$ layer above said first IC's electrical contacts are created;
- depositing indium on said patterned photoresist and in said recesses;
- removing said photoresist such that said indium is lifted off of said first IC except in said recesses;
- providing said mating IC, said mating IC including conductive pins positioned to align with the indium in respective recesses; and
- hybridizing said first and mating ICs by bringing said conductive pins into contact with said indium in said recesses such that said indium deforms and said pins make electrical contact with said first IC's electrical contacts.

14. The method of claim 13, wherein said first IC is a control IC and said mating IC is a detector array having a pixel pitch of <10 μm.

15. The method of claim 13, wherein said conductive pins are tapered.

16. A hybrid device, comprising:
- a first IC, the surface of which includes at least one electrical contact for connection to a mating IC;
- an insulating layer on the surface of said first IC which has been patterned and etched to provide recesses in said insulating layer above each of said electrical contacts;
- a deformable conductive material in each of said recesses; and
- a mating IC which includes conductive pins positioned to align with the deformable conductive material in respective ones of said recesses;
- said pins contacting said deformable conductive material in said recesses such that said deformable conductive material is deformed and said pins make electrical contact with said first IC's electrical contacts, such that said first and mating ICs form a hybrid device.

17. The device of claim 16, wherein said insulating layer is $SiO_2$.

18. The device of claim 16, wherein said deformable conductive material is indium.

19. The device of claim 16, wherein said first IC is a control IC and said mating IC is a detector array.

20. The device of claim 19, wherein said detector array has a pixel pitch of <10 μm.

21. The device of claim 16, wherein said conductive pins are tapered.

22. The device of claim 16, wherein said conductive pins are connected to respective contact pads in said mating IC.

* * * * *